US008866650B2

(12) United States Patent
Spinks et al.

(10) Patent No.: US 8,866,650 B2
(45) Date of Patent: Oct. 21, 2014

(54) APPARATUS, SYSTEMS AND METHODS FOR FOR DIGITAL TESTING OF ADC/DAC COMBINATION

(75) Inventors: Stephen J. Spinks, Swindon (GB); Andrew Talbot, Chieveley (GB); Colin Mair, Swindon (GB)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/992,765

(22) PCT Filed: Dec. 7, 2011

(86) PCT No.: PCT/US2011/063768
§ 371 (c)(1),
(2), (4) Date: Jun. 10, 2013

(87) PCT Pub. No.: WO2013/085506
PCT Pub. Date: Jun. 13, 2013

(65) Prior Publication Data
US 2014/0191890 A1    Jul. 10, 2014

(51) Int. Cl.
*H03M 1/10*    (2006.01)
*H03M 1/46*    (2006.01)
*H03M 1/66*    (2006.01)

(52) U.S. Cl.
CPC .............. *H03M 1/1071* (2013.01); *H03M 1/10* (2013.01); *H03M 1/46* (2013.01); *H03M 1/66* (2013.01)
USPC ............. 341/120; 363/74; 323/234; 323/304; 324/750.3; 714/718; 341/122; 341/144; 341/155; 341/169

(58) Field of Classification Search
CPC ........... H03M 1/10; H03M 1/12; H03M 1/66; H03M 1/46; H03M 1/108; H03M 1/109; H03M 1/1071; H03M 1/1095; G01R 31/3167; G01R 31/3187; G05F 3/00
USPC .......... 341/120, 122, 144, 155, 169; 714/718; 324/750.3; 323/234, 304; 363/74
See application file for complete search history.

(56) References Cited

U.S. PATENT DOCUMENTS 5,483,237 A * 1/1996 Guzinski ...................... 341/120
5,659,312 A * 8/1997 Sunter et al. ................. 341/120
(Continued)

FOREIGN PATENT DOCUMENTS

WO    2013/085506 A1    6/2013

OTHER PUBLICATIONS

International Search Report and Written Opinion Received for PCT Patent Application No. PCT/US2011/063768, mailed on Aug. 29, 2012, 8 pages.

(Continued)

*Primary Examiner* — Lam T Mai
(74) *Attorney, Agent, or Firm* — Ellis B. Ramirez; PRASS, LLP

(57) ABSTRACT

A circuit for testing digital-to-analog (DAC) and analog-to-digital converters (ADC) is provided. The circuit applies a code pattern having a plurality of sequential values to the digital to analog converter. A plurality of built-in test switches (BTS) couple at least one tap voltage from the DAC to a test bus and to the ADC as a variable reference input voltage. In one form, the circuit uses incremental digital codes to test for defects in a resistor string, a switch array, and a decode logic that form part of the DAC. In another form, the circuit uses the tap voltages from the DAC to test the comparators that form part of the ADC. Instead of performing time-consuming analog to digital conversions, the functionality of the above mentioned circuitry is tested by varying the code pattern around a reference point and by selecting the appropriate combination of BTS switches.

20 Claims, 5 Drawing Sheets

(56) References Cited

U.S. PATENT DOCUMENTS

| | | | |
|---|---|---|---|
| 5,909,180 A * | 6/1999 | Bailey et al. | 340/639 |
| 5,909,186 A | 6/1999 | Gohringer | |
| 6,229,465 B1 * | 5/2001 | Bulaga et al. | 341/120 |
| 6,492,923 B1 * | 12/2002 | Inoue et al. | 341/120 |
| 6,557,131 B1 * | 4/2003 | Arabi | 714/734 |
| 6,987,472 B2 * | 1/2006 | Lin | 341/120 |
| 7,062,401 B1 * | 6/2006 | McGrath | 702/117 |
| 7,081,841 B1 * | 7/2006 | Feist et al. | 341/120 |
| 7,271,751 B2 * | 9/2007 | Peterson et al. | 341/120 |
| 7,355,537 B2 * | 4/2008 | Lin | 341/120 |
| 7,522,077 B1 * | 4/2009 | Itkin | 341/120 |
| 7,633,416 B2 * | 12/2009 | Horisaki | 341/120 |
| 8,106,801 B2 * | 1/2012 | Dasnurkar | 341/120 |
| 8,310,385 B2 * | 11/2012 | Dasnurkar | 341/120 |
| 8,510,073 B2 * | 8/2013 | Dasnurkar | 702/117 |
| 8,659,309 B2 * | 2/2014 | Howe et al. | 324/750.3 |
| 8,659,457 B2 * | 2/2014 | Eliezer et al. | 341/120 |
| 2007/0182612 A1 | 8/2007 | Peterson et al. | |
| 2008/0238741 A1 | 10/2008 | Horisaki | |
| 2011/0181312 A1 | 7/2011 | Ouslis et al. | |

OTHER PUBLICATIONS

International Preliminary Report on Patentability and Written Opinion received for PCT Patent Application No. PCT/US2011/063768, mailed on Jun. 19, 2014, 5 pages.

* cited by examiner

APPARATUS, SYSTEMS AND METHODS FOR FOR DIGITAL TESTING OF ADC/DAC COMBINATION

BACKGROUND

1. Field of the Disclosed Embodiments

The disclosure relates to test circuits and more specifically to a system and method for performing a test on analog to digital and digital to analog circuits.

2. Introduction

In many integrated circuits (ICs), both an Analog to Digital Converter (ADC) and Digital to Analog Converters (DAC) are present, to allow digital signal processing (DSP) of analog input signals and generation of an analog result. This is often called a "mixed signal" IC.

Testing of embedded analog/mixed-signal cores is considered a difficult problem in System on Chip (SoC) IC testing. In general, various design-for-test (DFT) schemes are used to access the embedded analog blocks such as digital-to-analog converters (DAC) and analog-to-digital converters (DAC), while the testing is performed by specialized hardware such as mixed-signal automatic test equipment (ATE) or an IC tester. The difficulty in testing embedded analog/mixed signal blocks is primarily due to difficulties in applying the test stimuli to the analog blocks and observing the response of the analog blocks for evaluation. This difficulty is further enhanced due to the fact that these blocks require an analog signal as test input or their response output is an analog signal. Thus, a simple binary comparison cannot be conducted in testing.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DISCLOSED EMBODIMENTS

Figure 1:
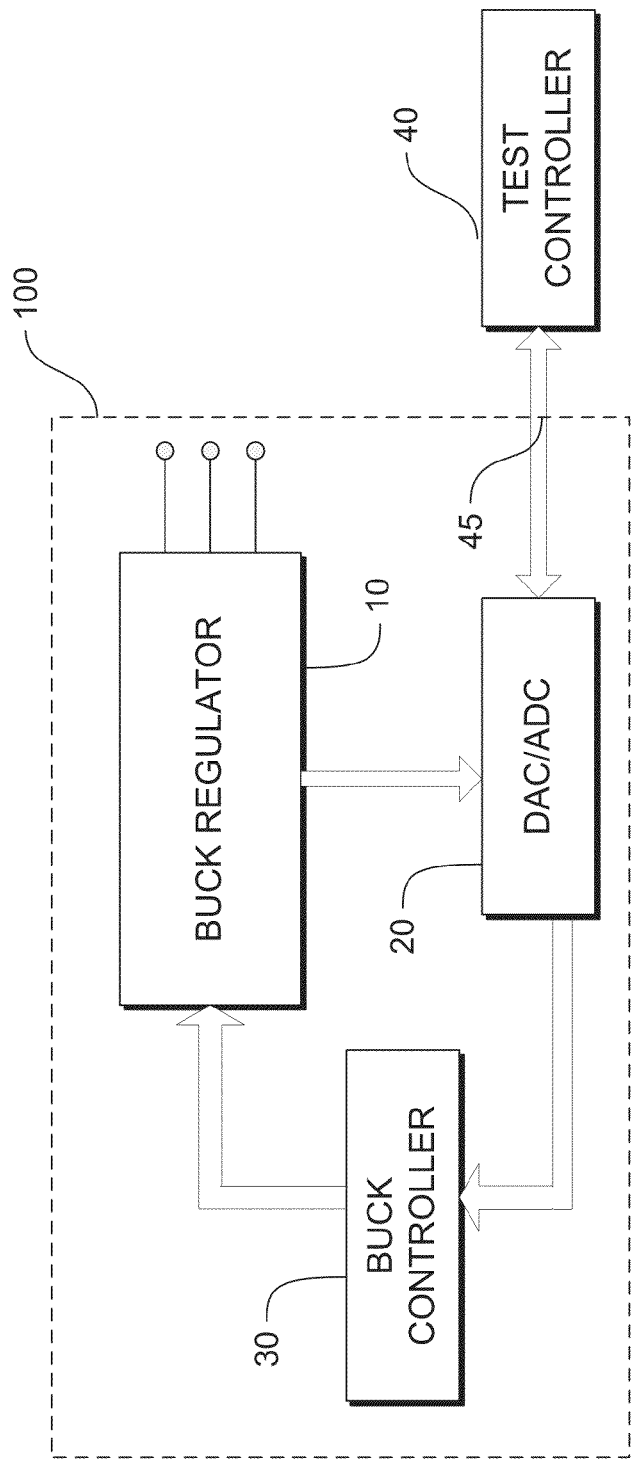
FIG. 1 illustrates a buck regulator with Digital to Analog Converter (DAC) and Analog to Digital Converter (ADC) in accordance to an embodiment.

Additional features and advantages of the disclosure will be set forth in the description which follows, and in part will be obvious from the description, or may be learned by practice of the disclosure. The features and advantages of the disclosure may be realized and obtained by means of the instruments and combinations particularly pointed out in the appended claims. These and other features of the present disclosure will become more fully apparent from the following description and appended claims, or may be learned by the practice of the disclosure as set forth herein.

Although embodiments of the invention are not limited in this regard, discussions utilizing terms such as, for example, "processing," "computing," "calculating," "determining," "applying," "receiving," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of resistors" may include two or more resistors.

The term "controller" is used herein generally to describe various apparatus relating to the operation of one or more device that directs or regulates a process or machine. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

FIG. 1 illustrates a buck regulator with Digital to Analog Converter (DAC) and Analog to Digital Converter (ADC) in accordance to an embodiment. Integrated circuits 100 (IC) are typically powered from one or more DC supply voltages provided by external supplies and converters. The power is provided through pins, leads, lands, or bumps on the integrated circuit package. The traditional method for providing such high power to integrated circuits may involve the use of a high-efficiency, programmable DC-to-DC (switch-mode) power converter located near or within the IC package. This type of converter is known as a buck regulator. FIG. 1 illustrates a general configuration for a buck regulator circuit in integrated circuit 100. The configuration comprises a buck regulator 10 that may include drivers, switches, inductor, capacitors, and buck controller 30. Buck controller 30 provides control signals to regulate the output voltage of buck regulator 10. The buck controller 30 generates the control signals responsive to a feedback voltage received from DAC/ADC circuit 20. In addition, IC 100 may include a test controller 40. The test controller induces test signals and receives outputs from DAC/ADC 20 through a test bus 45. Test bus 45 comprises an analog test bus and a digital test bus. Test controller 40 outputs a pass or fail after determining whether either of DAC or ADC is faulty. Test controller 40 may be an on-die controller such as a finite state machine. In one embodiment, the test controller is a remote HVM tester.

Figure 2:
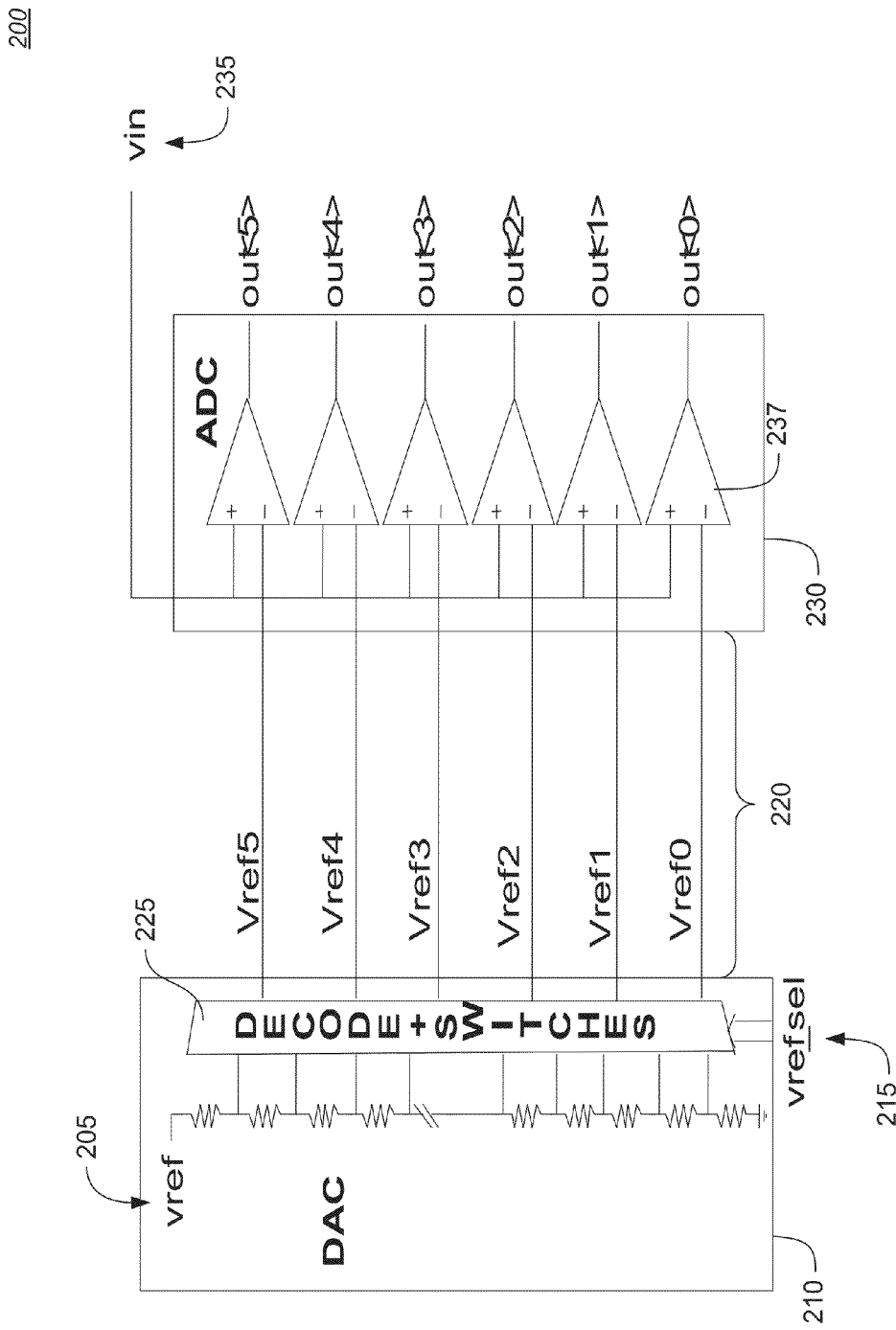
FIG. 2 illustrates a Digital to Analog Converter (DAC) and Analog to Digital Converter (ADC) useable in a buck regulator in accordance to an embodiment.

FIG. 2 illustrates a Digital to Analog Converter (DAC) and Analog to Digital Converter (ADC) useable in a buck regulator in accordance to an embodiment. The illustrated combination of DAC 210 and ADC 230 is commonly used in the feedback loop of a digitally controlled buck regulator which may be embedded in System on Chip (SOC) for the purposes of power delivery. When used in the digital buck regulator loop, the DAC 210 is used to generate a set of reference voltage levels 220 which are used within the feedback loop to regulate the output voltage. The DAC 210 is implemented as a resistor string with switches 225 independently controlled (FIG. 3) by a digital bus signal 215 (vref_sel) to tap different voltages 220 to the ADC 230 inputs as shown in FIG. 4 comprising comparators 237 that compares one of the tap voltages 220 to a regulated buck output voltage 235. The ADC outputs (OUT<0> . . . OUT<5>) will be available to the HVM tester as a digital word via test bus 45.

Figure 3:
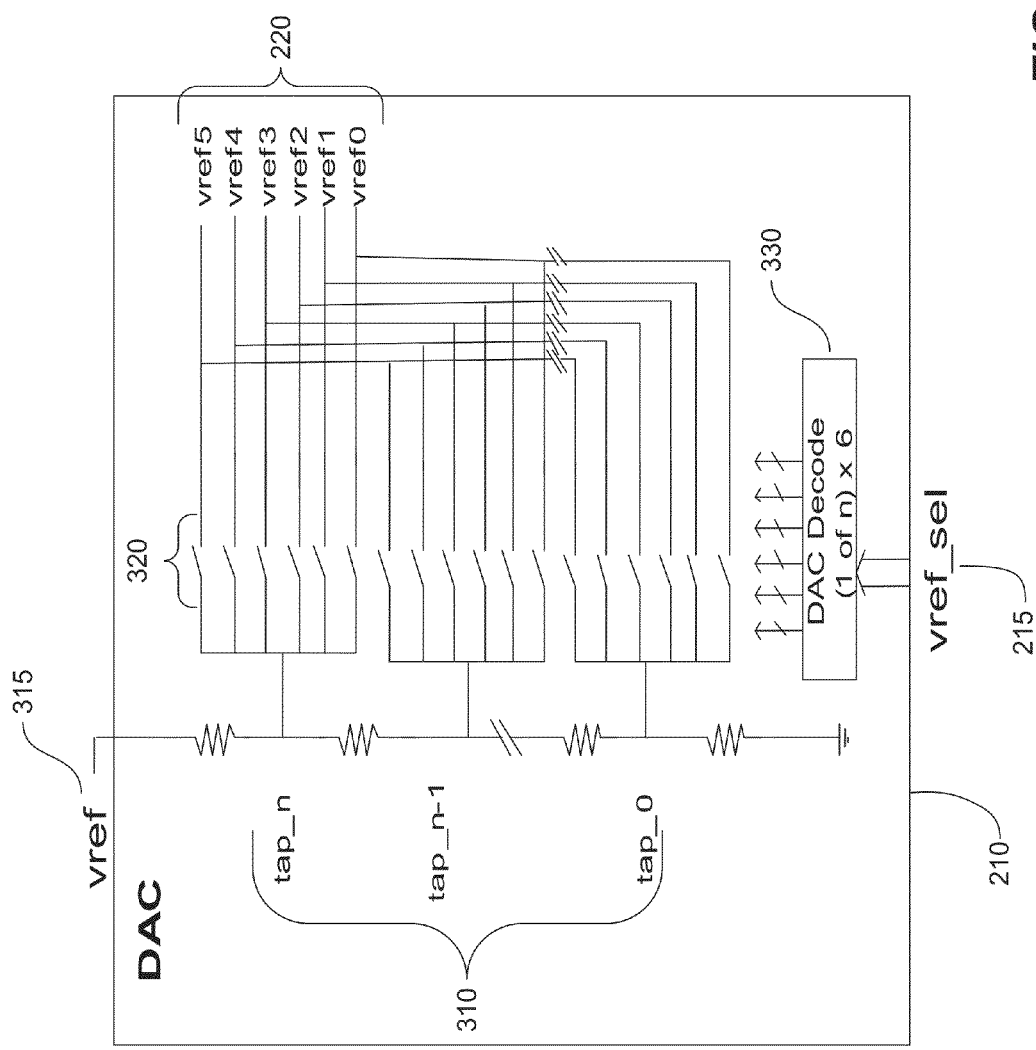
FIG. 3 illustrates a Digital to Analog Converter (DAC) in accordance to an embodiment.
Figure 4:
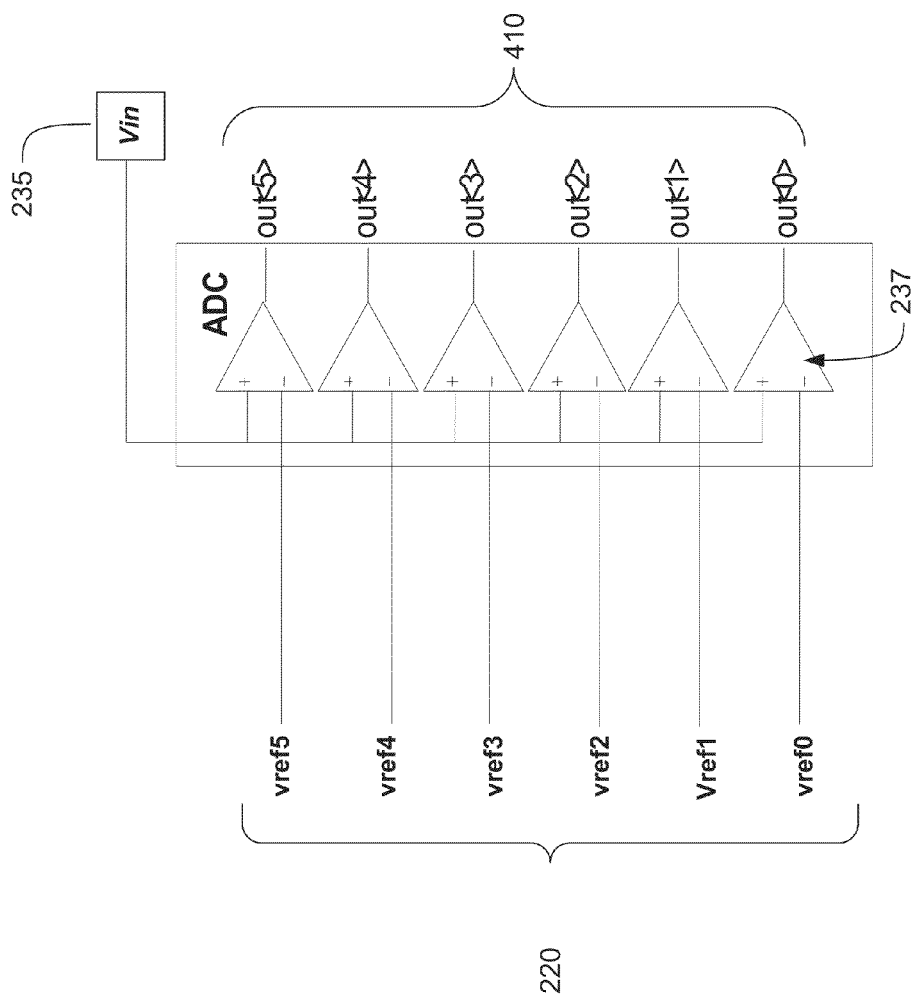
FIG. 4 illustrates an Analog to Digital Converter (ADC) in accordance to an embodiment.

FIG. 3 illustrates a Digital to Analog Converter (DAC) in accordance to an embodiment. FIG. 3 illustrates a digital to analog converter 210 comprising a plurality of resistors 315 configured in a resistor string, a plurality of switches 320 connected to the plurality of resistors, and decoder logic 330 adapted to control the plurality of switches based on a code pattern (vref_sel) to generate the at least one tap voltage (220). The resistor string, which can be folded resistor string or a series resistor string, is used to reduce the large parasitic capacitance otherwise present in DAC converters. Using a folded resistor string also helps reduce the complexity of the decoders used to control the switches. In this example, the DAC 210 is implemented as a plurality of resistors 315 connected in series between reference voltage potentials (Vref 205). The resistors can be matched resistors (e.g., unit resistors) such that the voltage drop across each of the resistors remains constant (e.g., evenly spaced voltages). The nodes between each of the resistors are connected through a switching network 320 to provide the DAC output 220 (vref0 . . . vref5). That is, the switching network 320, which can be implemented as a multiplexer, is operative to selectively connect a given output node (tap_n . . . tap_0) to the output 220 based on the value of a digital input word (Vref_sel 215) as decoded by decoder logic 330. The DAC 210 typically has a number of nodes equal to the number of possible values of the digital input word. The illustration shows a six (6) level decoder, however the principle can be applied to ADCs with an arbitrary number of levels. In accordance with an embodiment, DAC 210 includes a tap 310 at one or more nodes that is operative to source or sink current into or out of the node. By configuring the tap 310 to source or sink a desired amount of current relative to the node, the portion of the DAC 210 between the node and reference voltage 205 and the portion of the DAC between the node and second reference voltage (not shown) will exhibit different linear incremental voltage changes between nodes. It should be understood and appreciated that any number of taps could be connected at corresponding nodes in DAC 210 in accordance with an aspect of the present invention. In this way, virtually any arbitrary transfer characteristic (e.g., exponential, logarithmic, S-shaped, and the like) can be approximated in accordance with an aspect of the present invention.

FIG. 4 illustrates an Analog to Digital Converter (ADC) in accordance to an embodiment. The analog input signal or taps (vref0 . . . vref5), output 220 of DAC 210, are connected to differential input stages, comparators 237, to quantize the input voltage 235. The output 410 of ADC 230 is a digital equivalent (out<0> . . . out<5>) that is fed to a digital test bus for use by a controller such as buck controller 30 or test controller 40. Digital values may be compared to expected values to determine if the ADC or DAC is faulty. The comparators 237 comprise operational amplifier which serve to amplify the voltage difference at the input nodes 220 and 235 to that of the outputs 410, out<0> . . . out<5>, which each change over time in response to the output at DAC 210. During non-testing operation, voltage 235 is set to a normal mode reference voltage as supplied by a battery source. During testing of the DAC/ADC, voltage 235 is set by a built-in test switch and could be varied around a midpoint voltage to test the comparators as they switched to different output levels.

Figure 5:
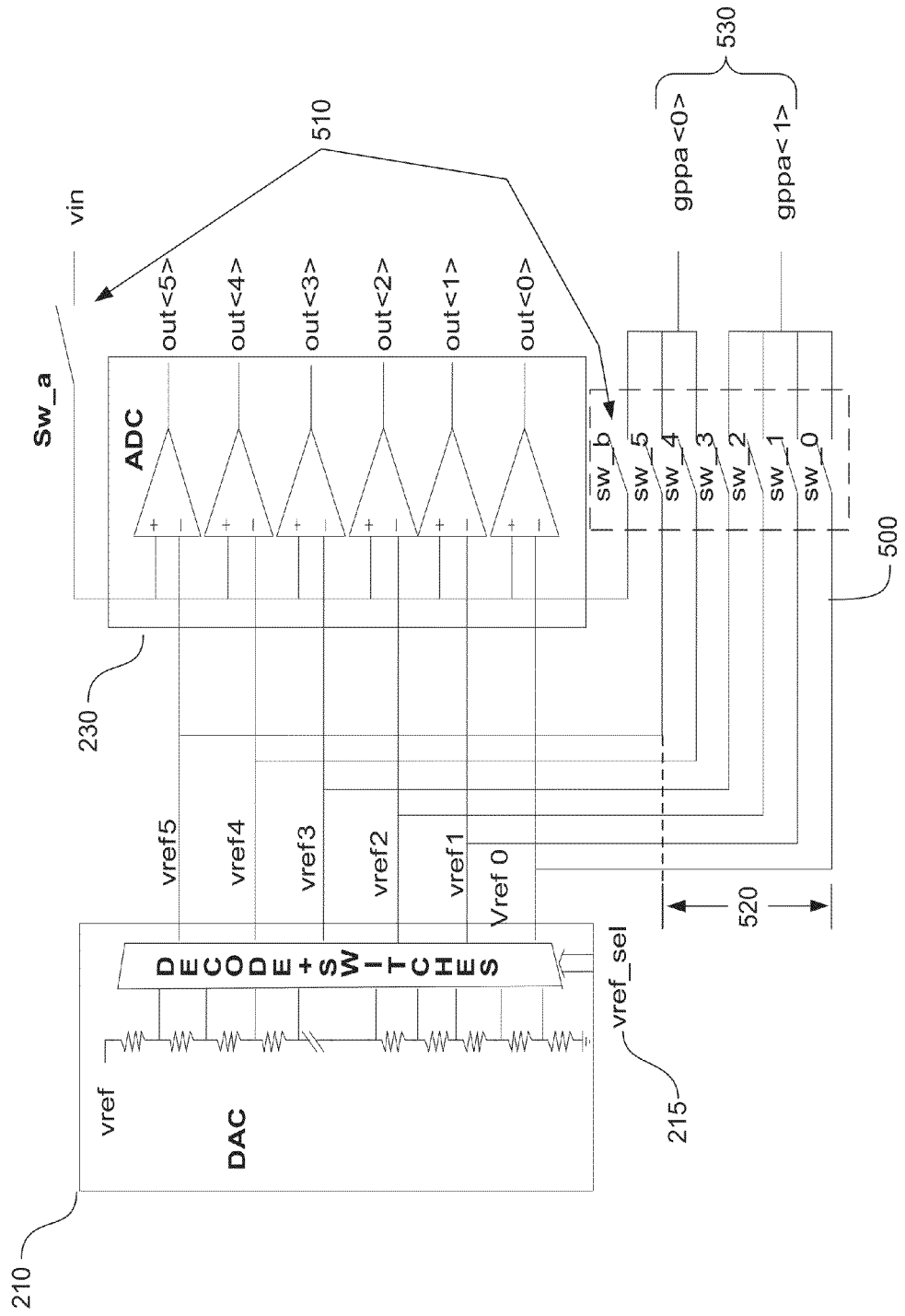
FIG. 5 illustrates DAC and ADC architecture with added design-for-test circuitry in accordance to an embodiment.

FIG. 5 illustrates DAC and ADC architecture with added design-for-test circuitry in accordance with an embodiment. FIG. 5 shows circuitry for testing DAC/ADC (see FIG. 2) using on silicon, built in test switches 500 and an analog test bus 530. Further, note that a switch (sw_a) has been placed in series with voltage 235 so as to isolate it from comparators 237. Outputs 530 (gppa<1> and gppa<0>) form part of the analog test bus capable of routing analog signals from DAC 210 to the test controller or HVM tester. Switches (sw_0, sw_1, sw_2, sw_3, sw_4, sw_5, sw_a, and sw_b) are on-die switches which may be implemented for example as CMOS pass gates. These switches and the vref_sel 215 signals are controllable from the test controller or HVM tester and output signals (out<0> . . . out<5>) 410 are observable by the test controller 40 or HVM tester. During test vref_sel 215 is a code pattern having a plurality of sequential values. The decode switch 225 decodes the code pattern into a voltage corresponding to inputted data level, and then outputs the converted data into tap voltages Vref0 to vref5. During a normal-mode operation, switch sw_a is closed and all other switches are open.

By utilizing the built-in test switches 500, the DAC 210 and ADC 230 combination may be tested in 4 steps as follows:

1) The resistor string and switches and decode logic associated with vref5 are tested by closing sw_5, sweeping vref_sel through all possible values of vref5 and measuring the values on the analog test bus (e.g. gppa<0>).

2) The ADC comparators 0 to 4 can be tested by:
 a. Setting vref0,vref1,vref2,vref3 and vref4 to mid code using vref_sel,
 b. Closing sw_0 to sw_5 in turn and measuring vref0 to vref4
 c. Open sw_a
 d. Close sw_b which applies vref5 to the positive input of the comparators
 e. Sweep vref5 from midcode-r to midcode+r and check where the comparator outputs, out<0> to out<4>, flip. Here, r is a value suitable to capture the input offset value of the comparators.

3) The DAC switches and decode logic for vref0 to vref4 can then be tested by:
 a. For each of vref level n to x−n
 b. Setting vref0 to vref4 to value x
 c. Sweeping vref5 voltage x−n to x+n by applying incremental digital codes to vref_sel.
 d. Monitoring the ADC switching point out<0> to out<4>. Any significant offset measured in stage 2) can be factored in to the switching point decision criteria at this stage.

4) Finally the ADC comparator 5 can be tested by
 a. Setting vref5 to mid code using vref_sel
 b. Closing sw_4 and sw_b which applies vref4 to the positive input of comparator 5
 c. Sweep vref4
 d. vref5 from midcode−n to midcode+n and check where the comparator output, out5 flips. Here, n is a value suitable to capture the input offset value of the comparator.

Using this test methodology avoids using any analog test input stimulus and has reduced the number of analog tests required to test the DAC 210 resistor chain, switches and comparators from Nswitches×Nlevels to Nswitches+Nlevels where Nswitches and Nlevels are the number of reference signals and DAC levels respectively. This example has shown the testing of a six (6) level ADC 230. However, the principle can be applied to ADCs with an arbitrary number of levels. Similarly there are two analog test bus lines described here but this could be any number from one to the number of comparators as long as any two vref lines (vref0 . . . vref5) can be independently connected via switches to the positive input node of the comparators. The additional on-chip test circuitry consists of additional switches 500 which has very low overhead in terms of performance and silicon area.

Embodiments within the scope of the present disclosure may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Embodiments of the present invention provide a non-volatile computer readable medium encoded with computer executable instructions, which when accessed, cause a machine to perform a built in self test (BIST) of the DAC/ADC circuits.

Although the above description may contain specific details, they should not be construed as limiting the claims in any way. Other configurations of the described embodiments of the disclosure are part of the scope of this disclosure. For example, the principles of the disclosure may be applied to each individual user where each user may individually deploy such a system. This enables each user to utilize the benefits of the disclosure even if any one of the large number of possible applications do not need the functionality described herein. In other words, there may be multiple instances of the components each processing the content in various possible ways. It does not necessarily need to be one system used by all end users. Accordingly, the appended claims and their legal equivalents should only define the disclosure, rather than any specific examples given.

We claim:

1. A testing circuit comprising:
 a plurality of built-in test switches capable of coupling at least one tap voltage from a digital to analog converter (DAC) to a test bus and capable of providing an analog to digital converter (ADC) with a variable reference input voltage;
 a test pattern generator capable of generating a code pattern having a plurality of sequential values; and
 a test controller having an input terminal connected to the test bus, thereby receiving an output signal from the ADC and DAC resulting from application of the code pattern to the DAC and control of the plurality of built-in test switches;
 wherein the test controller is capable of configuring the plurality of built-in test switches between a test-mode operation and a normal-mode operation.

2. The testing circuit of claim 1, wherein the digital to analog converter comprises a plurality of resistors configured in a resistor string, a plurality of switches connected to the plurality of resistors, and decoder logic adapted to control the plurality of switches based on the code pattern to generate the at least one tap voltage.

3. The testing circuit of claim 2, wherein the analog to digital converter comprises a plurality of comparators to receive at least one tap voltage from the DAC and the variable reference input voltage.

4. The testing circuit of claim 3, wherein the test controller in the test-mode operation is capable of determining whether the digital to analog converter (DAC) or the analog to digital converter (ADC) is faulty.

5. The testing circuit of claim 4, wherein the test bus comprises an analog test bus and a digital test bus.

6. The testing circuit of claim 3, wherein the plurality of comparators can be tested by setting one of the at least one tap voltage to mid code using the generated code pattern and sweeping one of the at least one tap voltage through a series of values.

7. The testing circuit of claim 3, wherein the plurality of switches, decode logic, plurality of resistors can be tested sweeping the code pattern through a series of values and measuring the response of the ADC and the DAC at the analog test bus and the digital test bus.

8. The testing circuit of claim 1 wherein the test controller is located at a high volume manufacturing tester.

9. A method, comprising:
 coupling a digital to analog converter (DAC) an analog to digital converter (ADC) via at least one analog line;
 applying a code pattern having a plurality of sequential values to the digital to analog converter;
 switching a plurality of built-in test switches to couple at least one tap voltage from the DAC to a test bus and to couple a variable reference input voltage to the ADC;

receiving at a test controller an output signal from the ADC and DAC resulting from application of the code pattern to the DAC and control of the plurality of built-in test switches;

wherein the test controller is capable of configuring the plurality of built-in test switches between a test-mode operation and a normal-mode operation.

10. The method of claim 9, wherein the digital to analog converter comprises a plurality of resistors configured in a resistor string, a plurality of switches connected to the plurality of resistors, and decoder logic adapted to control the plurality of switches based on the code pattern to generate the at least one tap voltage.

11. The method of claim 10, wherein the analog to digital converter comprises a plurality of comparators to receive at least one tap voltage from the DAC and the variable reference input voltage.

12. The method of claim 11, wherein the test bus comprises an analog test bus and a digital test bus.

13. The method of claim 11, wherein the test controller in the test-mode operation is capable of determining whether the digital to analog converter (DAC) or the analog to digital converter (ADC) is faulty.

14. The method of claim 12, wherein the plurality of comparators can be tested by setting a set of the at least one tap voltage to mid code using the generated code pattern and sweeping one of the at least one tap voltage through a series of values.

15. The method of claim 12, wherein the plurality of switches, decode logic, plurality of resistors can be tested sweeping the code pattern through a series of values and measuring the response of the ADC and the DAC at the analog test bus and the digital test bus.

16. A semiconductor die comprising:
a digital to analog converter (DAC) comprising a plurality of resistors configured in a resistor string, a plurality of switches connected to the plurality of resistors, and decoder logic adapted to control the plurality of switches based on a code pattern to generate at least one tap voltage;

an analog to digital converter (ADC) comprising a plurality of comparators to receive at least one tap voltage from the digital to analog converter and a variable reference input voltage;

on-die circuitry capable of enabling the use of one tap voltage as an input to the plurality of comparators and to disconnect the plurality of comparators from an input voltage to be digitized; wherein the digital to analog converter and the analog to digital converter are coupled to a test controller via a test bus; and wherein the test controller is capable of configuring the on-die circuitry between a test-mode operation and a normal-mode operation.

17. The semiconductor die of claim 16, where the on-die circuitry is capable of coupling at least one tap voltage from the DAC to the test bus.

18. The semiconductor die of claim 17, wherein the test controller in the test-mode operation is capable of determining whether the digital to analog converter (DAC) or the analog to digital converter (ADC) is faulty.

19. The semiconductor die of claim 18, wherein the test bus comprises an analog test bus and a digital test bus.

20. The semiconductor die of claim 19, wherein the plurality of comparators can be tested by setting one of the at least one tap voltage to mid code using the generated code pattern and sweeping one of the at least one tap voltage through a series of values; and wherein the plurality of switches, decode logic, plurality of resistors can be tested sweeping the code pattern through a series of values and measuring the response of the ADC and the DAC at an analog test bus and at a digital test bus.

* * * * *